(12) United States Patent
Monfray et al.

(10) Patent No.: US 7,638,844 B2
(45) Date of Patent: Dec. 29, 2009

(54) MANUFACTURING METHOD OF SEMICONDUCTOR-ON-INSULATOR REGION STRUCTURES

(75) Inventors: Stéphane Monfray, Grenoble (FR); Aomar Halimaoui, La Terrasse (FR); Philippe Coronel, Barraux (FR); Damien Lenoble, Grenoble (FR); Claire Fenouillett-Beranger, Grenoble (FR)

(73) Assignees: STMicroelectronics S.A., Mountouge (FR); Commissariat à l'énergie atomique, Paris (FR)

( * ) Notice: Subject to any disclaimer, the term of this patent is extended or adjusted under 35 U.S.C. 154(b) by 178 days.

(21) Appl. No.: 11/713,553

(22) Filed: Mar. 2, 2007

(65) Prior Publication Data
US 2008/0087959 A1    Apr. 17, 2008

Related U.S. Application Data

(63) Continuation of application No. 10/960,436, filed on Oct. 7, 2004, now abandoned.

(51) Int. Cl.
*H01L 23/62* (2006.01)
*H01L 21/00* (2006.01)

(52) U.S. Cl. .................... 257/347; 257/E23.008; 438/149

(58) Field of Classification Search ............ 438/431, 438/149; 257/347, E23.008
See application file for complete search history.

(56) References Cited

U.S. PATENT DOCUMENTS

| | | | | |
|---|---|---|---|---|
| 4,925,805 A | * | 5/1990 | van Ommen et al. | 438/407 |
| 5,316,957 A | * | 5/1994 | Spratt et al. | 438/311 |
| 5,534,459 A | | 7/1996 | Kim | |
| 6,096,582 A | | 8/2000 | Inoue et al. | |
| 6,611,023 B1 | * | 8/2003 | En et al. | 257/350 |
| 2002/0135020 A1 | | 9/2002 | Skotnicki et al. | |

OTHER PUBLICATIONS

French Search Report from French Patent Application 03/50665 filed Oct. 9, 2003.

* cited by examiner

*Primary Examiner*—W. David Coleman
(74) *Attorney, Agent, or Firm*—Lisa K. Jorgenson; James H. Morris; Wolf, Greenfield & Sacks, P.C.

(57) ABSTRACT

A single-crystal silicon region on insulator on silicon intended to receive at least one component, the insulator having overthicknesses.

55 Claims, 4 Drawing Sheets

MANUFACTURING METHOD OF SEMICONDUCTOR-ON-INSULATOR REGION STRUCTURES

CROSS REFERENCE TO RELATED APPLICATIONS

This application is a continuation of U.S. application Ser. No. 10/960,436, filed Oct. 7, 2004 entitled MANUFACTURING METHOD OF SEMICONDUCTOR-ON-INSULATOR REGION STRUCTURES, which application is incorporated herein by reference in its entirety.

BACKGROUND OF THE INVENTION

1. Field of the Invention

The present invention relates to methods for manufacturing structures of semiconductor regions on insulator.

The present invention is described hereafter in relation with the integration of a MOS transistor.

2. Discussion of the Related Art

FIG. 1 illustrates, in partial simplified cross-section view, the structure of a MOS transistor formed in a conventional silicon-on-insulator (SOI) region.

The transistor comprises an insulated gate G laid on a portion of a silicon substrate 2 on insulator of a first conductivity type, for example, P. More specifically, the portion of substrate 2 in which the transistor is formed is defined by vertical insulation areas 3 of shallow trench insulation (STI) type. Substrate 2 and trenches 3 rest upon an insulating layer 4 of a uniform thickness T that separates them from a semiconductor wafer 6. Source/drain regions 8 extend, at the surface of substrate 2, on either side of insulating spacers 10 formed around gate G.

The selection of the value of thickness T of insulator 4 interposed between wafer 6 and substrate 2 is a problem.

On the one hand, under source/drain regions 8, any capacitive coupling with wafer 6 should be reduced to a minimum. The value of thickness T of insulator 4 must thus be high.

On the other hand, when thickness T of insulator 4 increases, malfunctions linked to known so-called "short channel" effects can be observed. Such effects are linked to the channeling of the field lines in an insulator. Thickness T thus has to be limited to relatively low values.

For devices having a reduced length L of gate G, that is, smaller than 100 nm, value T is thus currently selected between 200 and 400 nm. However, this is only a compromise between two opposite constraints.

The above-described problems significantly increase as the component dimensions, especially gate length L and the thickness of substrate 2, decrease.

SUMMARY OF THE INVENTION

The present invention aims at providing a method of manufacturing a transistor structure with a small gate length in which the previously-described disadvantages are overcome.

The present invention more generally aims at providing a method for manufacturing a silicon-on-insulator structure intended to receive components of small dimensions.

To achieve these and other objects, the present invention provides a method for manufacturing a semiconductor region on insulator on silicon, comprising the steps of:

forming in single-crystal silicon a heavily-doped N-type buried layer of uniform thickness;

forming at least one heavily-doped N-type vertical region extending from the upper surface of the silicon at least to the buried layer;

forming, under and in contact with the buried layer, at least one heavily-doped N-type region; and selectively oxidizing the heavily-doped N-type regions and buried layer.

The present invention also provides a method for manufacturing a MOS transistor, comprising the steps of:

forming in single-crystal silicon a heavily-doped N-type buried layer of uniform thickness;

forming an insulated gate;

forming two vertical heavily-doped N-type regions extending from the upper surface of the silicon at least to the buried layer, the vertical regions being formed on either side of the gate and intact portions of the silicon being maintained between the gate and each of the vertical regions;

forming, under and in contact with the buried layer, two separate heavily-doped N-type regions which do not extend perpendicular to the gate; and selectively oxidizing all the heavily-doped N-type areas.

The foregoing and other objects, features, and advantages of the present invention will be discussed in detail in the following non-limiting description of specific embodiments in connection with the accompanying drawings.

DETAILED DESCRIPTION

Figure 1:
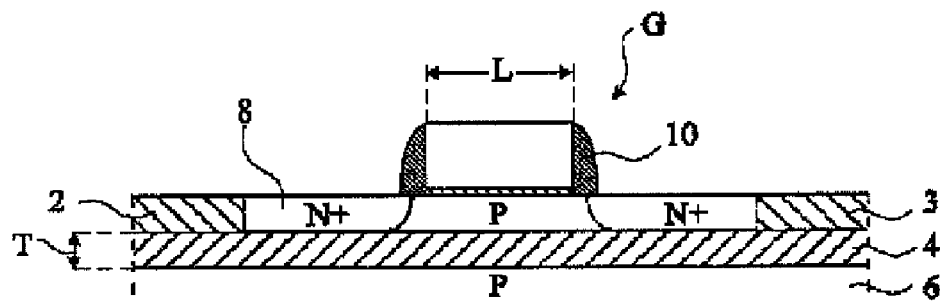
FIG. 1, previously described, is a partial simplified cross-section view of a MOS transistor formed on a conventional semiconductor-on-insulator region.

For clarity, the same elements have been referred to with the same reference numerals and further, as usual in the representation of integrated circuits, the various drawings are not to scale.

A feature of the present invention is to provide single-crystal semiconductor-on-insulator regions intended to receive at least one component, the insulator comprising overthicknesses.

The present invention will be described, as a non-limiting example, as applied to single-crystal silicon regions of substantially constant thickness (FIGS. 2 and 4A to 4F), and to single-crystal silicon regions comprising overthicknesses. In these last cases, an embodiment in which the overthicknesses of the insulator are under overthicknesses of the silicon region will be considered in relation with FIGS. 3A to 3H and another embodiment in which the overthicknesses of the insulator are under portions of the superposed silicon region comprising no overthickness will be considered in relation with FIG. 5.

First, a single-crystal semiconductor-on-insulator region intended to receive a component is considered in relation with FIGS. 2, 3A to 3H and 4A to 4F, the insulator comprising overthicknesses under selected areas of the component.

Figure 2:
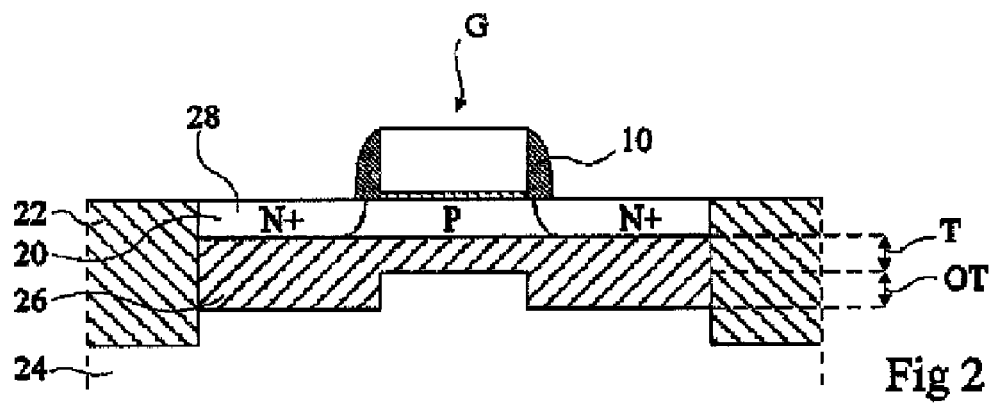
FIG. 2 is a partial simplified cross-section view of a semiconductor-on-insulator region according to an embodiment of the present invention.

FIG. 2 illustrates, in partial simplified cross-section view, an example of such a structure in the case where the component is a MOS transistor.

As illustrated in FIG. 2, a MOS transistor is formed in a single-crystal silicon region 20 delimited by insulating regions of STI-trench type 22. Region 20 is separated from a semiconductor single-crystal silicon wafer 24 by an insulator 26. The thickness of insulator 26 varies according to the superposed areas of the transistor. In the illustrated example, insulator 26 exhibits an overthickness OT under source and drain regions 28 of the transistor with respect to its thickness T under insulated gate G of the transistor.

Local overthicknesses OT enable overcoming the previously-described problems of conventional structures. In particular, they enable limiting the capacitive effects between source/drain regions 28 and underlying wafer 24. Further, thickness T of insulator 26 under the portion of region 20 forming the transistor channel is relatively small, which enables limiting the effects of short channels.

FIGS. 3A to 3H illustrate, in partial simplified cross-section view, different steps of a method for forming a structure similar to that in FIG. 2.

Figure 3A:
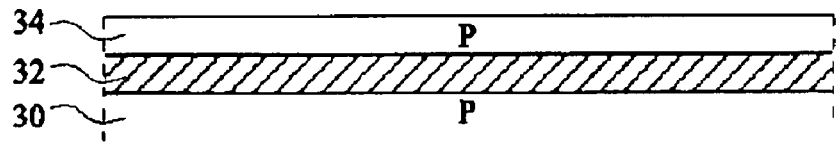
FIGS. 3A to 3H illustrate, in partial simplified cross-section view, different steps of a method for forming a semiconductor-on-insulator region according to an embodiment of the present invention.

As illustrated in FIG. 3A, the method according to the present invention uses an SOI-type structure comprising a semiconductor wafer 30 coated with an insulator 32 of uniform thickness, itself coated with a semiconductor region, for example, single-crystal silicon 34. Region 34 and underlying layer 30 are, for example, doped of a same first conductivity type, for example, P.

Figure 3B:
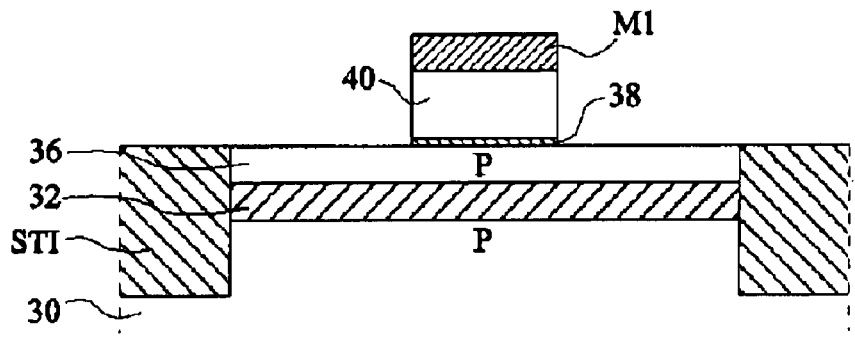

At the next steps, illustrated in FIG. 3B, trenches are dug into the stacking of layer 34, of insulator 32, and of layer 30. The trenches are then filled with an insulator to form STI insulating trenches. The STI insulating trenches are formed to extend from the upper surface of layer 34 into wafer 30. The STI trenches delimit in layer 34 a region 36 intended to receive at least one component. Then, steps specific to the forming of such a component can be carried out. For example, an insulated gate of a MOS transistor is formed by the successive deposition and etching of a gate insulator 38, such as a silicon oxide, and a gate conductor 40, for example, polysilicon. Preferably, after the etching for defining insulated gate 40-38, definition mask M1 of the gate is kept.

Figure 3C:
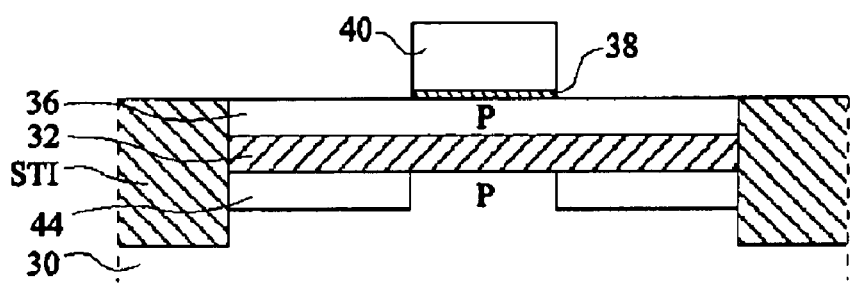

Then, as illustrated in FIG. 3C, an implantation is performed according to the pattern defined by mask M1. This implantation is performed with a sufficient power for the implanted element, for example, germanium, to cross thin silicon and insulating layers 34 and 32 and to stop in the upper portion of wafer 30. Mask M1 is then removed and a diffusion anneal intended to form in the implantation areas a single-crystal alloy, for example, silicon-germanium SiGe is carried out. SiGe areas 44 are thus formed under insulator 32 and in contact therewith. SiGe areas 44 extend from the STI trenches that they contact to the region underlying gate 38-40. SiGe areas 44 are formed only above the portions of region 36 intended to receive the source/drain of the transistor. Indeed, on the one hand, the germanium implantation is performed according to the pattern of mask M1, and on the other hand the conditions of the anneal are selected to limit the extension of areas 44 under gate 38-40.

It should further be noted that the in-depth extension of SiGe areas 44 is, preferably, limited to the in-depth extension of the STI trenches.

Figure 3D:
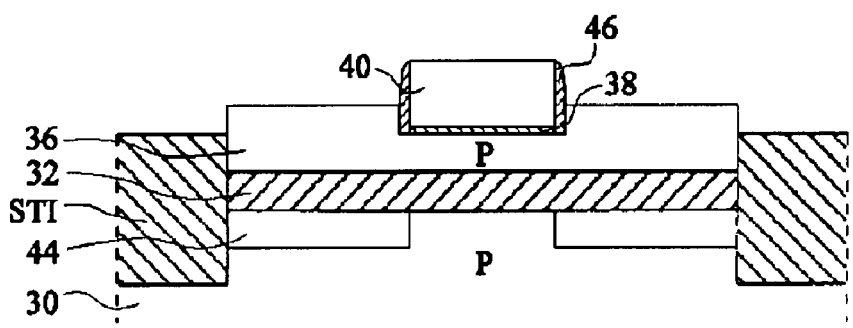

According to an alternative, illustrated in FIG. 3D, an epitaxial growth of silicon is then performed on region 36 to thicken it on either side of the gate. For example, such an epitaxial growth is performed after the forming of lateral spacers 46 around gate 38-40.

Figure 3E:
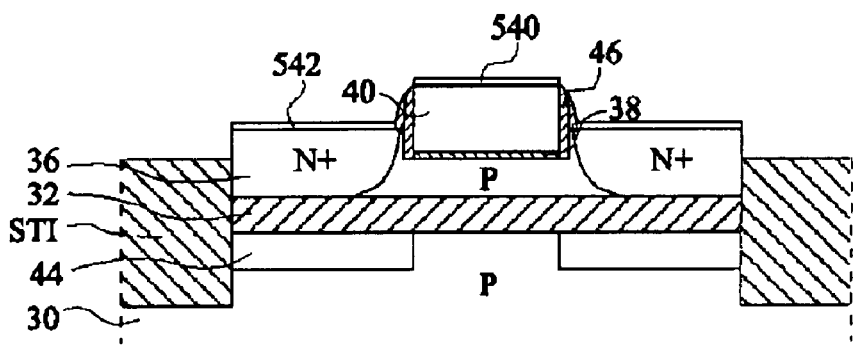

Then, as illustrated in FIG. 3E, spacers 50 are formed on the side of gate 38-40, and heavily-doped N-type drain/source regions 52 are formed by implantation/diffusion. Finally, the apparent silicon portions are silicided at surface 540 of gate electrode 40 as well as at surfaces 542 of source and drain 52.

Figure 3F:
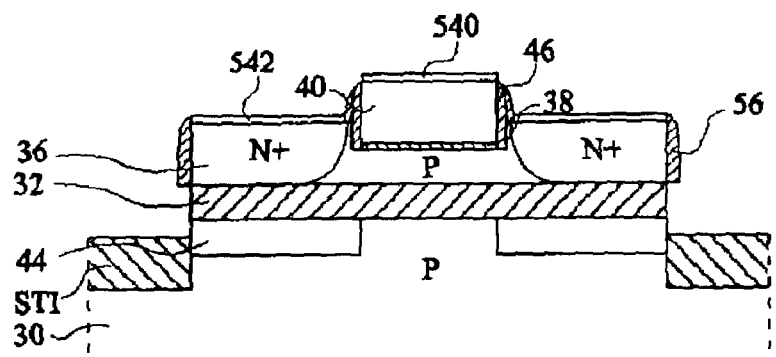

The method according to the present invention continues, as illustrated in FIG. 3F, with a selective etch of the insulator forming the STI insulation trenches. The etching is performed to at least partially expose the lateral walls of SiGe areas 44. This recess may be performed in a single step or, according to an alternative illustrated in FIG. 3F, in two steps. A first step then comprises removing the insulator from the STI trenches to reach—or reach slightly beyond—the upper surface of insulator 32. Spacers 56 are then formed on the exposed walls of region 36—and, possibly, of insulator 32. Spacers 56 are made of a material, preferably insulating, such that the insulator of the STI trenches is selectively etchable with respect to this material. Then, a second step of removal of the insulator from the STI trenches is carried out to expose at least partially the periphery of SiGe areas 44.

Figure 3G:
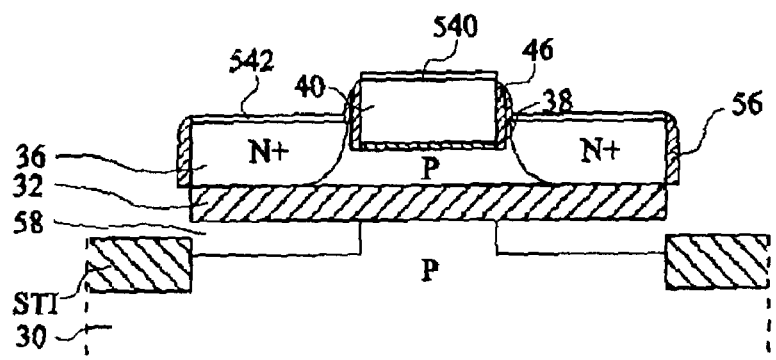

Then, as illustrated in FIG. 3G, silicon-germanium SiGe is selectively totally removed from areas 44 of FIG. 3F. Recesses 58 are thus formed at the locations of areas 44. Silicon-germanium SiGe can be selectively removed with respect to upper insulator 32 and to lower semiconductor wafer 30 by known methods such as a dry plasma etch.

Figure 3H:
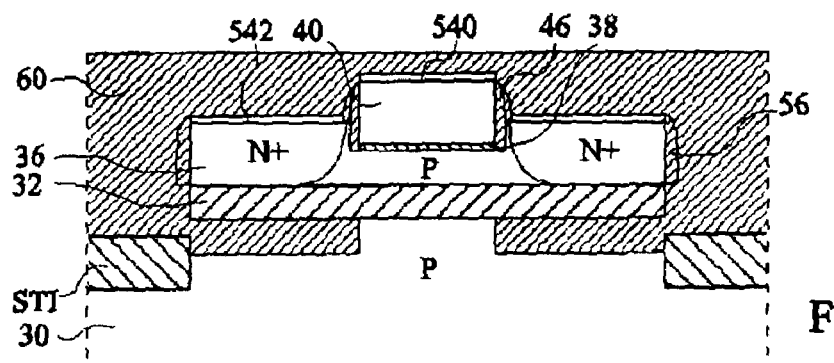

At the next steps, illustrated in FIG. 3H, an insulating material 60 is deposited to fill recesses 58 of FIG. 3G. Preferably, insulating material 60 is a multiple-layer of silicon nitride and of silicon oxide generally used to form the interlevel dielectric in which gate 38-40 is embedded. Layer or multiple-layer 60 is formed so that its upper surface is substantially planar, for example, by a deposition followed by a leveling of chem.-mech. polishing type (CMP).

The above method thus enables forming a silicon-on-insulator region 36 in which a MOS transistor is formed. The insulator under the transistor has a first thickness perpendicular to the transistor channel equal to the uniform thickness of initial layer 32. The insulator exhibits overthicknesses under drain/source regions 32 equal to the thickness of the portion of the insulating material 60 (FIG. 3H) for filling recesses 58 (FIG. 3G), that is, equal to the thickness of SiGe areas 44 (FIGS. 3C-F).

FIGS. 4A to 4F illustrate another embodiment of a single-crystal silicon-on-insulator region according to the present invention such as described previously in relation with FIG. 2.

Figure 4A:
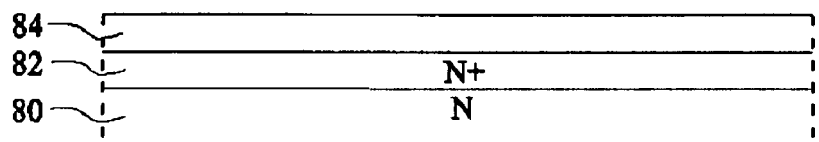
FIGS. 4A to 4F illustrate, in partial simplified cross-section view, a method for forming a semiconductor-on-insulator region according to another embodiment of the present invention.

As illustrated in FIG. 4A, the method according to the present invention starts from a semiconductor wafer 80, for example, single-crystal silicon. A very heavily-doped N-type ($N^+$) silicon layer 82 of uniform thickness and a lightly N-type doped, undoped, or P-type doped silicon layer 84 are successively formed on wafer 80, for example, by epitaxy.

Figure 4B:
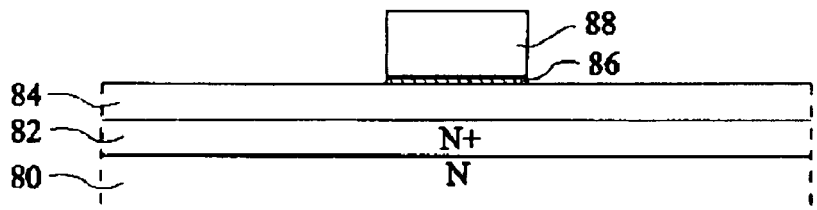

Then, as illustrated in FIG. 4B, the specific forming steps of a MOS transistor insulated gate are for example carried out. Thus, an insulator 86 and a conductor 88 are successively deposited and gate 86-88 is defined by successively etching these materials.

Figure 4C:
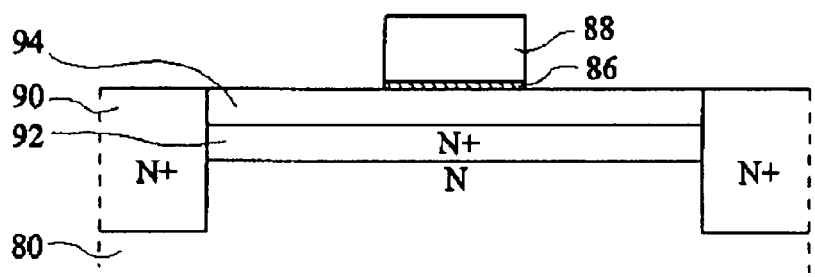

At the next steps, illustrated in FIG. 4C, an implantation/diffusion is performed to form heavily-doped N-type ($N^+$) vertical regions 90 in layers 84 and 82 extending, preferably, into wafer 80. A region 92 of layer 82 and a region 94 of layer 84 are thus delimited. Vertical regions 90 are formed so that region 94 (and thus underlying region 92) extends on either side of insulated gate 86-88.

Figure 4D:
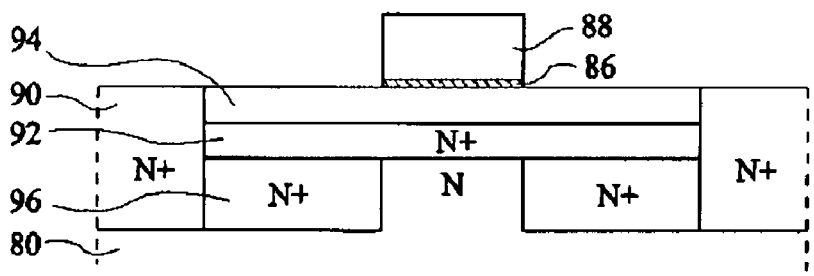

Then, as illustrated in FIG. 4D, a new implantation/diffusion of N-type dopants is performed with a sufficient power to form in the sole wafer 80 heavily-doped N-type (N+) regions 96. Regions 96 are formed right under heavily-doped layer 92 that they contact. For example, regions 96 are formed on either side of gate 86-88. Regions 96, preferably, extend to reach vertical region 90. A continuity 90-92-96 of heavily-doped N-type regions, a portion of which reaches the upper surface of the structure (upper portion of vertical regions 90) is thus formed.

Preferably, the N-type dopants used to form vertical and horizontal regions 90 and 96 are the same and are identical to the dopant of region 92, preferably phosphorus.

Figure 4E:
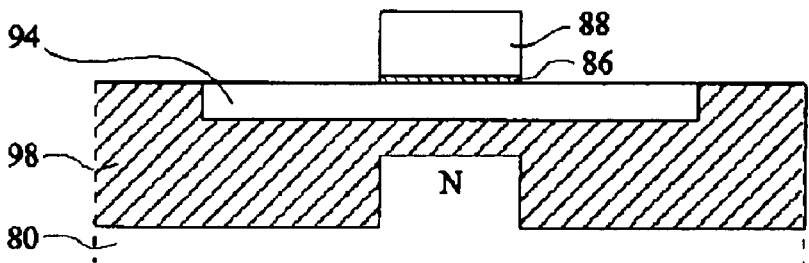

Then, as illustrated in FIG. 4E, a method for selectively oxidizing the sole N+ regions 90-92-96 is then implemented. For example, a method for turning N+ regions 90-92-96 into porous silicon, and for then selectively oxidizing the sole porous silicon portions is implemented. Such a method is known and is described, for example, in doctoral thesis of the Scientific and Medical University of Grenoble of J. J. Yon, entitled "Oxydation du silicium poreux" (Mar. 6, 1986), which is incorporated herein by reference.

It should be noted that insulating material 86 is selected not to be sensitive to the selective oxidation process of N+ regions 90-92-96. In the considered example, to resist against the transformation into porous silicon, insulator 86 is, preferably, an insulator with a high electric permeability, such as a hafnium oxide, a tantalum oxide, or any alloy containing at least one of these oxides or a multiple-layer comprising at least one of these oxides.

The N-type doping level of silicon regions 90-92-96 is preferably substantially uniform and selected to enable implementation of the method intended to make them selectively porous. For example, it is greater than $10^{17}$ at./cm$^3$.

A single-crystal silicon-on-insulator region 94 having its insulator 98 exhibiting overthicknesses under selected portions of silicon region 94 has thus been formed, as illustrated in FIG. 4E. More specifically, insulator 98 is thinner perpendicular to insulated gate 86-88.

Figure 4F:
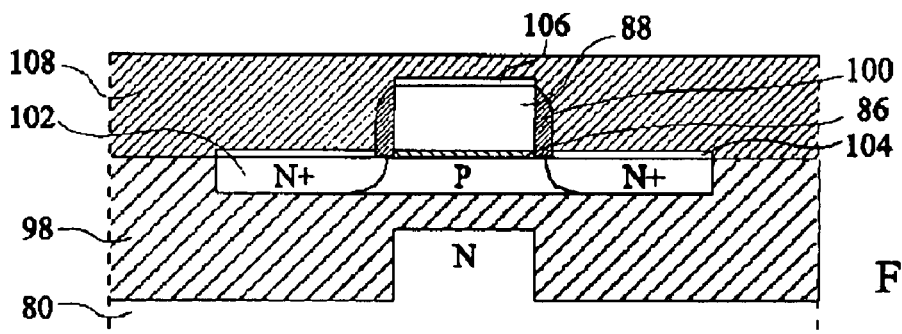

The method continues with MOS transistor forming steps comprising, for example, of forming by implantation/diffusion, on either side of gate 86-88 surrounded with spacers 100, heavily-doped N-type source/drain regions 102 and of siliciding the upper surfaces 104 of source/drain regions 102 and upper surface 106 of gate 86-88. The entire structure is then embedded in an interlevel dielectric 108, as illustrated in FIG. 4F.

Figure 5:
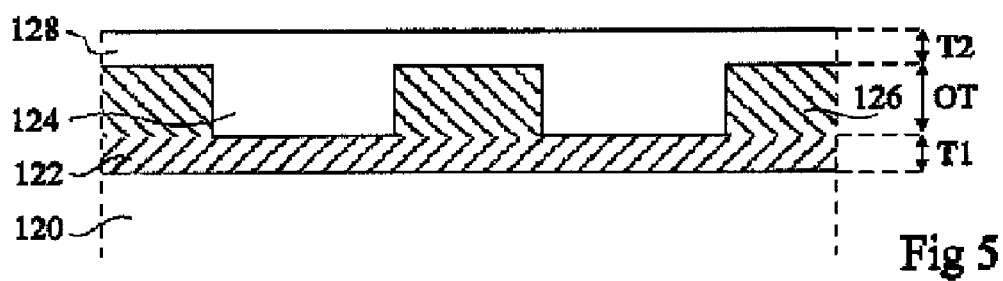
FIG. 5 is a partial simplified cross-section view of a semiconductor-on-insulator region according to another embodiment of the present invention.

FIG. 5 illustrates, in partial simplified cross-section view, a single-crystal silicon region 124-128 on an insulator 122-126 on silicon 120 according to another embodiment of the present invention. More specifically, thickness T1 or T1+OT of insulator 122-126 varies in inversely proportional fashion to thickness T2+OT or T2 of semiconductor region 124-128. Thus, insulator 122-126 comprises overthicknesses (OT) 126 under relatively thin portions (128) of semiconductor region 124-128.

Such a structure results, for example, from the implementation of a method similar to that described in relation with FIGS. 4A to 4F. It is started from a structure similar to that of FIG. 4A, comprising a semiconductor wafer 120 supporting a very heavily doped N-type silicon layer 122 of uniform thickness Ti and a lightly N-type doped, undoped, or P-type doped silicon layer 124. Heavily-doped N-type vertical regions 126 are then formed at the locations where overthicknesses OT of the insulator are to be formed. Vertical regions 126 are formed from the upper surface of upper layer 124 to reach heavily-doped N-type buried layer 122. An additional silicon layer 128 of a thickness T2 and, preferably, of the same conductivity type as layer 124, is then formed, for example, by epitaxy. Heavily-doped N-type regions 122 and 126 are then oxidized.

It should be noted that, to enable such an oxidation by the transformation method described in relation with FIG. 4E, it will be ascertained to maintain a surface access for some of the heavily-doped N-type vertical regions. For this purpose, an appropriate mask may for example be deposited before the epitaxy, which mask is removed at the beginning of the transformation process. A full plate epitaxy may also be performed, followed by an implantation/diffusion of N-type dopants to bring back to the surface the appropriate vertical regions.

A structure similar to that illustrated in FIG. 5 may advantageously be used to form side by side components of "fully-depleted" type and components of "partially depleted" type. The fully depleted components will then be formed above the insulator overthicknesses and the partially depleted components will be formed in the portions of the silicon region resting on the portions of the relatively thin insulator.

Of course, the present invention is likely to have various alterations, modifications, and improvements which will readily occur to those skilled in the art. In particular, the present invention has been discussed in relation with the forming of a MOS transistor in a single-crystal silicon region. However, it will be within the abilities of those skilled in the art to adapt the principles of the forming of a silicon-on-insulator region according to the present invention to the forming of several transistors in a same region. Similarly, those skilled in the art should understand that components other than MOS transistors or in addition to the MOS transistors could be formed. It will also be within the abilities of those skilled in the art to adapt these steps to the forming of one or several other such components.

It will be within the abilities of those skilled in the art to adapt the specific steps linked to the forming of a given component to the desired electric performances.

It will be within the abilities of those skilled in the art to select the forming method of a silicon region on an insulator comprising overthicknesses according to the present invention, according to the considered technological process.

Further, it will also be within the abilities of those skilled in the art to adapt the implementation conditions of the selected method to the desired performances. In particular, it will be within the abilities of those skilled in the art, in the case of the method described in relation with FIGS. 3A-H, to adapt the thickness of initial insulating region 32 and the conditions of the implantation/diffusion of the germanium of FIG. 3C to obtain the desired insulator thicknesses and overthicknesses. Similarly, it will be within the abilities of those skilled in the art to select the thickness of layer 82 and the implantation/diffusion conditions of vertical and horizontal regions 90 and 96 to obtain an insulating region 98 having thicknesses and overthicknesses adapted to a specific application. Similarly, it will be within the abilities of those skilled in the art to adapt the thickness and the doping of the semiconductor layer (20, FIG. 2; 36, FIG. 3H and 94, FIG. 4F) on insulator according to the present invention to the performances of the component formed in such a region.

Further, it will be within the abilities of those skilled in the art to make any necessary material and thickness modification in a given technological process. Thus, it should be understood by those skilled in the art that, in the embodiment of FIGS. 3A to 3H, it has been sought to form areas 44 (FIG. 3C)

intended to be selectively removed (FIG. 3G) with respect to underlying and peripheral semiconductor 30 and to the insulators forming upper insulating layer 32 and the neighboring STI trenches. For this purpose, germanium has been implanted. However, it would be possible to implant any other element, provided that the selective removal described in relation with FIG. 3G remains possible.

It should also be understood by those skilled in the art that the additional epitaxial growth of silicon described in relation with FIG. 3D is not indispensable and that the component—the MOS transistor—could be completely formed in the initial silicon thickness (layer 34). Similarly, it has been considered in FIG. 4F that source/drain regions 102 are formed directly in portion 94 of layer 84 defined by vertical regions 90. However, it should be understood by those skilled in the art that it is possible to perform an epitaxy to thicken semiconductor region 94 at the locations where source/drain regions 102 are formed, similarly to what has been described in relation with FIG. 3D for region 36 of layer 34. It will also be within the abilities of those skilled in the art, if necessary, to implement etch methods for locally reducing the thickness of the region.

Generally, the present invention relates to semiconductor-on-insulator regions, the insulator comprising overthicknesses and the regions exhibiting a constant thickness or at least two distinct thicknesses. Thus, FIGS. 2 and 4F illustrate embodiments of a silicon region 20, 94 with a substantially constant thickness. However, FIGS. 3H and 5 illustrate embodiments of a silicon region exhibiting two different thicknesses. It should further be understood by those skilled in the art that the semiconductor-on-insulator regions according to the present invention may exhibit variable insulator overthicknesses and more than two thicknesses of the semiconductor regions. Thus, in the embodiment of FIG. 5, additional specific implantations of N-type dopants may be performed before the oxidation of the heavily-doped N-type areas to locally adjust the thickness of insulator 126 and/or of the resulting silicon region 124-128 to desired values. Such an adjustment could also be obtained by performing additional local epitaxies, for example, after such an oxidation. Such an adjustment could also result from the combination of the performing, before oxidation of the heavily-doped N-type areas, of appropriate implantations and of the performing, after such an oxidation, of local epitaxies.

It has further been considered in the embodiment of FIGS. 4A to 4F that vertical regions 90—and thus the corresponding portions of insulator 98—are formed (FIG. 4C) to extend beyond layer 82 into wafer 80. However, it should be understood by those skilled in the art that it would be enough for vertical regions 90 to reach layer 82. Similarly, it has been considered in FIG. 5 that vertical regions 126 would stop on buried layer 122. It should however be understood by those skilled in the art that they may extend down to underlying wafer 120.

It should be noted that wafer 24, 30 or 80 has been used to designate a uniformly-doped silicon wafer as well as epitaxial areas or areas specifically doped by diffusion/implantation formed on or in a solid substrate. Similarly, it will be within the abilities of those skilled in the art to form the initial structure of FIG. 4A by appropriate doping/epitaxy.

Generally, although the present invention has been described in the context of a silicon manufacturing process, it applies to any manufacturing process of integrated circuits in which a semiconductor region is desired to be formed on an insulator comprising overthicknesses under at least one component formed in the considered semiconductor region or under at least one selected area of at least one component formed in the considered semiconductor region.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising:
    a semiconductor region;
    an insulating region disposed adjacent to the semiconductor region and under the semiconductor region,
    a surrounding insulating region delimiting the semiconductor region and that is separate from the insulating region that is adjacent to and disposed under the semiconductor region; and
    an overthickness under the insulating region and that is formed at a common time and of a common material as the surrounding insulating region, the overthickness having a thickness substantially equal to a thickness of the insulating region that is disposed adjacent and under the semiconductor region.

2. The circuit of claim 1, wherein the semiconductor region comprises single-crystal silicon.

3. The circuit of claim 1, further comprising a semiconductor wafer spaced from the semiconductor region by at least the insulating region.

4. The circuit of claim 1, further comprising a gate disposed on the semiconductor region, wherein the selected area of the semiconductor region is located adjacent and laterally from a gate region.

5. The circuit of claim 1, wherein the selected area of the semiconductor region comprises a source/drain region.

6. The circuit of claim 1, wherein the surrounding insulating region comprises a shallow wench insulation type region.

7. The circuit of claim 3, wherein the insulating region abuts the semiconductor wafer.

8. A method for manufacturing a semiconductor region on insulator on silicon, comprising:
    forming in single-crystal silicon a heavily-doped N-type buried layer of uniform thickness;
    forming at least one heavily-doped N-type vertical region extending from the upper surface of the silicon at least to the buried layer;
    forming, under and in contact with the buried layer, at least one heavily-doped N-type region; and
    selectively oxidizing the heavily-doped N-type regions and buried layer.

9. The method of claim 8, wherein the dopant concentration of the N-type regions and of the buried layer is higher than $10^{17}$ at/cm$^3$.

10. A method for manufacturing a MOS transistor, comprising:
    forming in single-crystal silicon a heavily-doped N-type buried layer of uniform thickness;
    forming an insulated gate;
    forming two vertical heavily-doped N-type regions extending from the upper surface of the silicon at least to the buried layer, the vertical regions being formed on either side of the gate and intact portions of the silicon being maintained between the gate and each of the vertical regions;
    forming, under and in contact with the buried layer, two separate heavily-doped N-type regions which do not extend perpendicular to the gate; and selectively oxidizing all the heavily-doped N-type areas.

11. The method of claim 10, wherein the dopant concentration of the N-type regions and of the buried layer is higher than $10^{17}$ at/cm$^3$.

12. A method for manufacturing an integrated circuit comprising:
providing a semiconductor wafer;
forming an insulating region above the semiconductor wafer;
forming a semiconductor region above the insulating region;
forming an implantation region as a layer of single crystal alloy under a selected area of the semiconductor region;
removing the implantation region forming a recess region; and
depositing an insulating material within the recess region.

13. The method of claim 12, wherein providing the semiconductor wafer comprises providing a single-crystal silicon semiconductor wafer.

14. The method of claim 12, wherein forming the semiconductor region comprises forming the semiconductor region of single-crystal silicon.

15. The method of claim 12, further comprising doping the semiconductor wafer and semiconductor region of a similar conductivity.

16. The method of claim 12, wherein forming the implantation region comprises forming shallow type insulation type regions on lateral sides of the semiconductor wafer.

17. The method of claim 12, wherein forming the layer of single crystal alloy comprises forming a layer of silicon-germanium.

18. The method of claim 12, wherein forming the implantation region under a selected area comprises forming the implantation region under a source/drain region.

19. The method of claim 12, wherein forming the semiconductor region comprises thickening the semiconductor region above the source/drain region.

20. The method of claim 12, wherein removing the implantation region forming a recess region comprises selectively etching the implantation region.

21. The method of claim 12, wherein depositing the insulating material comprises depositing one or a combination of silicon nitride and silicon oxide.

22. The method of claim 16, wherein forming the shallow type insulation type regions comprises forming trenches and filling the trenches with an insulating material.

23. The method of claim 22, wherein forming trenches comprises removing material from the upper surface of the semiconductor region extending into the semiconductor wafer.

24. The method of claim 19, wherein thickening the semiconductor region above the source/drain region comprises thickening through epitaxial growth.

25. The method of claim 20, wherein forming of the recess region comprises exposing at least partially a periphery of the implantation region to the selectively etching.

26. A method for manufacturing an integrated circuit comprising:
providing a semiconductor wafer;
forming an insulating region above the semiconductor wafer;
forming a semiconductor region above the insulating region, including thickening the semiconductor region above a source/drain region of the semiconductor;
forming an implantation region under a selected area of the semiconductor region;
removing the implantation region forming a recess region; and
depositing an insulating material within the recess region.

27. The method of claim 26, wherein thickening the semiconductor region above the source/drain region comprises thickening through epitaxial growth.

28. The method of claim 26, wherein providing the semiconductor wafer comprises providing a single-crystal silicon semiconductor wafer.

29. The method of claim 26, wherein forming the semiconductor region comprises forming the semiconductor region of single-crystal silicon.

30. The method of claim 26, further comprising doping the semiconductor wafer and semiconductor region of a similar conductivity.

31. The method of claim 26, wherein forming the implantation region comprises forming shallow type insulation type regions on lateral sides of the semiconductor wafer.

32. The method of claim 26, wherein forming the implantation region under a selected area comprises forming the implantation region under a source/drain region.

33. The method of claim 26, wherein removing the implantation region forming a recess region comprises selectively etching the implantation region.

34. The method of claim 26, wherein depositing the insulating material comprises depositing one or a combination of silicon nitride and silicon oxide.

35. The method of claim 31, wherein forming the shallow type insulation type regions comprises forming trenches and filling the trenches with an insulating material.

36. The method of claim 35, wherein forming trenches comprises removing material from the upper surface of the semiconductor region extending into the semiconductor wafer.

37. The method of claim 33, wherein forming of the recess region comprises exposing at least partially a periphery of the implantation region to the selectively etching.

38. A method for manufacturing an integrated circuit comprising:
providing a semiconductor wafer;
forming an insulating region above the semiconductor wafer;
forming a semiconductor region above the insulating region;
forming an implantation region under a selected area of the semiconductor region;
removing the implantation region forming a recess region by selectively etching the implantation region; and
depositing an insulating material within the recess region.

39. The method of claim 38, wherein forming of the recess region comprises exposing at least partially a periphery of the implantation region to the selectively etching.

40. The method of claim 38, wherein providing the semiconductor wafer comprises providing a single-crystal silicon semiconductor wafer.

41. The method of claim 38, wherein forming the semiconductor region comprises forming the semiconductor region of single-crystal silicon.

42. The method of claim 38, further comprising doping the semiconductor wafer and semiconductor region of a similar conductivity.

43. The method of claim 38, wherein forming the implantation region comprises forming shallow type insulation type regions on lateral sides of the semiconductor wafer.

44. The method of claim 38, wherein forming the implantation region under a selected area comprises forming the implantation region under a source/drain region.

45. The method of claim 38, wherein depositing the insulating material comprises depositing one or a combination of silicon nitride and silicon oxide.

46. The method of claim 43, wherein forming the shallow type insulation type regions comprises forming trenches and filling the trenches with an insulating material.

47. The method of claim 46, wherein forming trenches comprises removing material from the upper surface of the semiconductor region extending into the semiconductor wafer.

48. A method for manufacturing an integrated circuit comprising:
provinding a semiconductor wafer;
forming an insulating region above the semiconductor wafer;
forming a semiconductor region above the insulating region;
forming an implantation region under a selected area of the semiconductor region;
removing the implantation region forming a recess region; and
depositing an insulating material within the recess region, the insulating material comprising one or a combination of silicon nitride and silicon oxide.

49. The method of claim 48, wherein providing the semiconductor wafer comprises providing a single-crystal silicon semiconductor wafer.

50. The method of claim 48, wherein forming the semiconductor region comprises forming the semiconductor region of single-crystal silicon.

51. The method of claim 48, further comprising doping the semiconductor wafer and semiconductor region of a similar conductivity.

52. The method of claim 48, wherein forming the implantation region comprises forming shallow type insulation type regions on lateral sides of the semiconductor wafer.

53. The method of claim 48, wherein forming the implantation region under a selected area comprises forming the implantation region under a source/drain region.

54. The method of claim 52, wherein forming the shallow type insulation type regions comprises forming trenches and filling the trenches with an insulating material.

55. The method of claim 54, wherein forming trenches comprises removing material from the upper surface of the semiconductor region extending into the semiconductor wafer.

* * * * *

UNITED STATES PATENT AND TRADEMARK OFFICE
CERTIFICATE OF CORRECTION

PATENT NO. : 7,638,844 B2
APPLICATION NO. : 11/713553
DATED : December 29, 2009
INVENTOR(S) : Stephane Monfray et al.

It is certified that error appears in the above-identified patent and that said Letters Patent is hereby corrected as shown below:

Title page, Item 30 should read:
(30)  Foreign Application Priority Data
Oct. 9, 2003  (FR) ................03/50665

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,638,844 B2
APPLICATION NO. : 11/713553
DATED : December 29, 2009
INVENTOR(S) : Stéphane Monfray et al.

It is certified that error appears in the above-identified patent and that said Letters Patent is hereby corrected as shown below:

Title Page, Item 75 Inventors: should read:
(75) Monfray; Stéphane (Grenoble, FR),
Halimaoui; Aomar (La Terrasse, FR),
Coronel; Philippe (Barraux, FR),
Lenoble; Damien (Grenoble, FR),
Fenouillet-Beranger; Claire (Grenoble, FR)

Title Page, Item 73 Assignee: should read:
(73) STMicroelectronics S.A. (Montrouge, FR)
Commissariat a l'Energie Atomique (Paris, FR)

Signed and Sealed this

Twentieth Day of April, 2010

David J. Kappos
*Director of the United States Patent and Trademark Office*